US 8,610,464 B2

(12) United States Patent
Spits

(10) Patent No.: US 8,610,464 B2
(45) Date of Patent: Dec. 17, 2013

(54) LOW-CURRENT INVERTER CIRCUIT

(75) Inventor: Erwin Spits, Utrecht (NL)

(73) Assignee: Epcos AG, Munich (DE)

( * ) Notice: Subject to any disclaimer, the term of this patent is extended or adjusted under 35 U.S.C. 154(b) by 0 days.

(21) Appl. No.: 13/321,128

(22) PCT Filed: Jun. 15, 2010

(86) PCT No.: PCT/EP2010/058385
§ 371 (c)(1),
(2), (4) Date: Jan. 24, 2012

(87) PCT Pub. No.: WO2010/146049
PCT Pub. Date: Dec. 23, 2010

(65) Prior Publication Data
US 2012/0127767 A1    May 24, 2012

(30) Foreign Application Priority Data

Jun. 17, 2009    (EP) .................................. 09162993

(51) Int. Cl.
*H03K 19/094*    (2006.01)

(52) U.S. Cl.
USPC .............................. 326/83; 326/112; 326/114

(58) Field of Classification Search
USPC ................. 326/81–83, 86–87, 112–114, 122; 327/108–109, 333
See application file for complete search history.

(56) References Cited

U.S. PATENT DOCUMENTS

| 3,700,981 A | 10/1972 | Masuhara et al. |
| 3,775,693 A | 11/1973 | Proebsting |
| 4,365,172 A * | 12/1982 | Prater .............................. 326/87 |
| 4,459,497 A * | 7/1984 | Kuo et al. ........................ 327/51 |
| 4,978,904 A | 12/1990 | Fitzpatrick et al. |
| 5,091,662 A | 2/1992 | Yung et al. |
| 5,208,488 A * | 5/1993 | Takiba et al. .................... 327/77 |
| 5,598,106 A * | 1/1997 | Kawasaki et al. ................ 326/21 |
| 5,910,737 A | 6/1999 | Kesler |
| 6,078,194 A * | 6/2000 | Lee ................................. 326/116 |
| 6,239,623 B1 * | 5/2001 | Tsutsui .......................... 326/119 |
| 7,202,863 B2 * | 4/2007 | Kimura et al. ................. 345/204 |
| 7,550,998 B2 * | 6/2009 | Brazis et al. ..................... 326/83 |
| 7,750,705 B2 * | 7/2010 | Ueno ............................. 327/198 |
| 2003/0020520 A1 * | 1/2003 | Miyake et al. ................. 327/112 |
| 2005/0040852 A1 * | 2/2005 | Mentze et al. ................... 326/81 |
| 2005/0189968 A1 * | 9/2005 | Brazis et al. .................... 327/112 |
| 2007/0297225 A1 * | 12/2007 | Tanzawa .................... 365/185.01 |
| 2008/0150577 A1 * | 6/2008 | Ueno ............................... 326/33 |

FOREIGN PATENT DOCUMENTS

| EP | 0 415 768 A2 | 3/1991 |
| GB | 1 436 988 A | 5/1976 |
| JP | 61-161020 A | 7/1986 |
| JP | 2-280413 A | 11/1990 |

* cited by examiner

*Primary Examiner* — Shawki Ismail
*Assistant Examiner* — Christopher Lo
(74) *Attorney, Agent, or Firm* — Slater & Matsil, L.L.P.

(57) ABSTRACT

The circuit includes an E-mode transistor with gate-source junction, a D-mode transistor with gate-source junction, a component generating a voltage drop between the source of the D-mode transistor and the drain of the E-mode transistor, and a connection between the drain of the E-mode transistor and the gate of the D-mode transistor. The gate of the E-mode transistor is provided for an input signal, and the drain of the E-mode transistor is provided for an output signal.

16 Claims, 2 Drawing Sheets

US 8,610,464 B2

LOW-CURRENT INVERTER CIRCUIT

This patent application is a national phase filing under section 371 of PCT/EP2010/058385, filed Jun. 15, 2010, which claims the priority of European patent application 09162993.1, filed Jun. 17, 2009, each of which is incorporated herein by reference in its entirety.

TECHNICAL FIELD

This invention is concerned with low-current inverter circuits for applications in GaAs technology.

BACKGROUND

Conventional logic circuits in GaAs technology use a transistor in combination with a large resistor. These circuits require both high input drive currents and high currents in the on-state because of the required voltage drop over the resistor. Furthermore, the resistor occupies a large chip area to provide the desired large resistance.

SUMMARY OF THE INVENTION

In one aspect, the invention presents a low-current inverter circuit that can be realized in GaAs technology.

The circuit according to the invention can be realized in GaAs technology and does not require large currents. Several components available in this technology, especially merged or stacked FET-HBT integration schemes, often called BiFET or BiHEMT and containing both HBT and FET or P-HEMT devices on a single GaAs substrate, can be used to render a low-current circuitry. The low-current inverter circuit, which makes use of E-mode (enhancement) and D-mode (depletion) FETs comprising gate-source junctions and/or gate-drain junctions, delivers the desired voltages while always limiting its currents to a minimum.

An input transistor and a feedback transistor, each comprising a source, a drain and a gate controlling a channel between source and drain and each having a gate-source junction are used in the circuit. The input transistor is an E-mode transistor, which is conducting between the source and the drain if the gate-source voltage is more (larger) positive than a positive threshold voltage and which is not conducting between the source and the drain if the gate-source voltage is lower. The feedback transistor is a D-mode transistor, which is not conducting between the source and the drain if the gate-source voltage is more negative than a negative threshold voltage and which is conducting between the source and the drain if the gate-source voltage is above the threshold voltage (less negative, zero or positive). The transistors can be symmetric with respect to source and drain, so that a gate-source junction and a similar gate-drain junction are available.

The source of the feedback transistor is connected to the drain of the input transistor via a component that generates a voltage drop. The drain of the input transistor is connected to the gate of the feedback transistor. Thus a feedback loop connecting the source of the feedback transistor to the gate of the feedback transistor is formed. The source of the input transistor is connected to a first level of a supply voltage, and the drain of the feedback transistor is connected to a second level of the supply voltage. The gate of the input transistor is provided for an input signal, and the drain of the input transistor is provided for an output signal. The component that generates a voltage drop between the source of the feedback transistor and the drain of the input transistor can especially be provided by a gate-source junction or by a gate-drain junction of a further transistor. The junctions of the further transistor may be switched in parallel by connecting source and drain. Gate-source junctions or gate-drain junctions of further transistors can be connected in series to obtain the adequate value of the voltage drop. Instead, the component that generates a voltage drop can be provided by a diode, especially a diode formed by the basis and the emitter or collector of a bipolar or heterobipolar transistor. A circuit of this latter design is especially suitable as an output buffer of the low-current inverter circuit to drive a high-impedance load like a depletion-mode FET or a depletion-mode P-HEMT, for example.

BRIEF DESCRIPTION OF THE DRAWINGS

These and other objects, features and advantages of the low-current inverter circuit will become apparent from the following detailed description of examples in conjunction with the appended figures.

Figure 1:
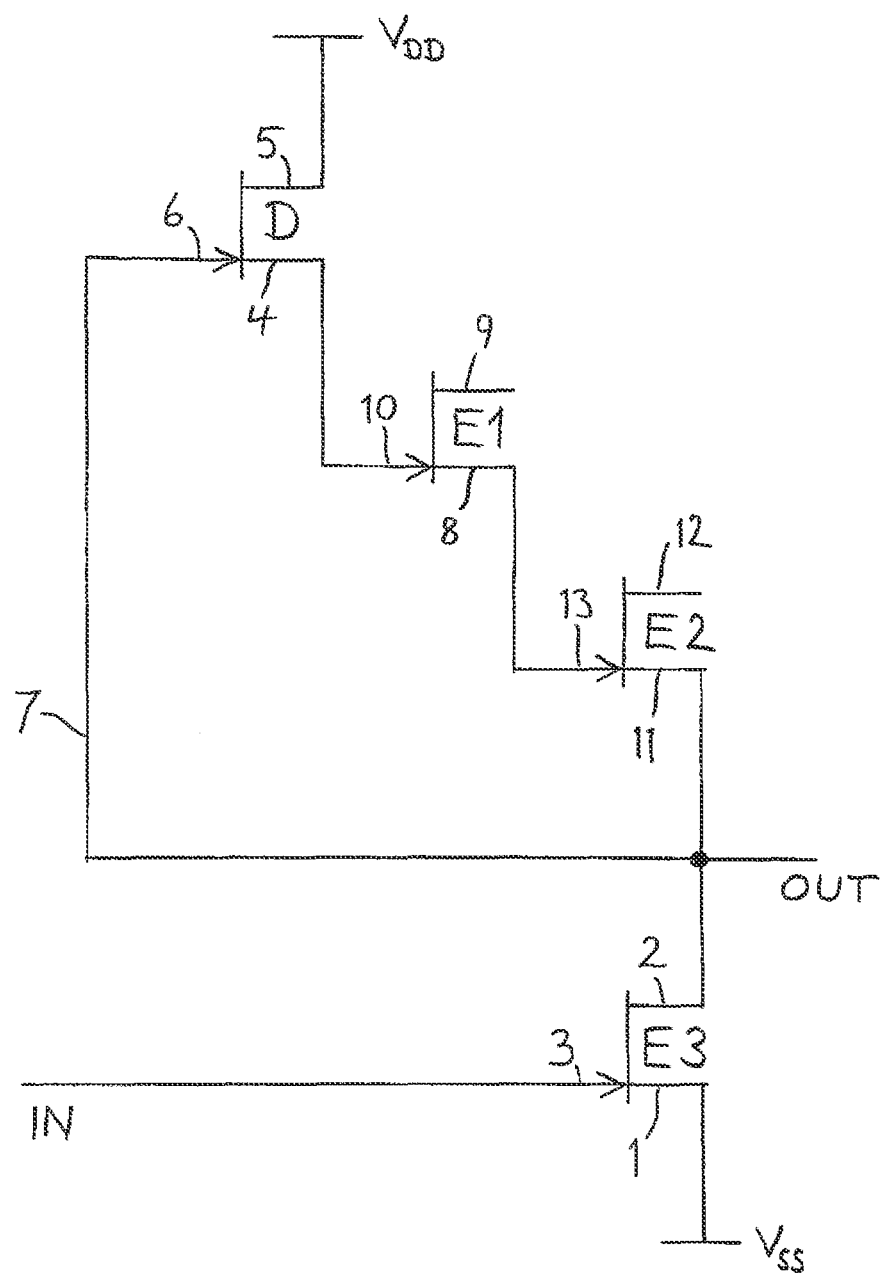
FIG. 1 shows a circuit diagram of an embodiment of the circuit.

The following list of reference symbols may be used in conjunction with the drawings:

1 source of the input transistor
2 drain of the input transistor
3 gate of the input transistor
4 source of the feedback transistor
5 drain of the feedback transistor
6 gate of the feedback transistor
7 connection
8 source of a further transistor
9 drain of a further transistor
10 gate of a further transistor
11 source of a further transistor
12 drain of a further transistor
13 gate of a further transistor
14 further diode
15 source of the input transistor
16 drain of the input transistor
17 gate of the input transistor
18 source of the feedback transistor
19 drain of the feedback transistor
20 gate of the feedback transistor
21 connection
D feedback transistor
D1 feedback transistor
E input transistor
E1 further transistor
E2 further transistor
E3 input transistor
IN input signal
OUT output signal
$V_{DD}$ high potential level of a supply voltage
$V_{SS}$ low potential level of a supply voltage

DETAILED DESCRIPTION OF ILLUSTRATIVE EMBODIMENTS

FIG. 1 shows a first embodiment of the low-current inverter circuit. The transistors appearing in the circuit are a kind of field-effect transistor comprising source, drain and gate as well as a diode formed by a junction between gate and source or drain. The transistors are therefore represented in the circuit diagram by symbols used for n-channel JFETs, but other types of transistors having a comparable structure can be used as well. In the examples shown in the figures, the gate-source junctions of the transistors are used.

The transistors designated with a D (D-mode, depletion mode) are characterized by a negative threshold voltage. If a gate-source voltage is applied that is larger negative (which means negative and of a larger absolute value) than the negative threshold voltage, the source-drain path through the channel of the transistor is non-conducting. If the transistor is considered as a switch, the switch is open if the gate-source voltage is larger negative than the threshold voltage. This type of transistor may therefore be characterized as "normally-on". If the gate-source voltage is not as negative as the threshold voltage or if it is zero or positive, the source-drain path is conducting and therefore the switch is closed.

The transistors designated with an E as E-mode (enhancement mode) transistors are characterized by a positive threshold voltage. The E-mode transistors are conducting between source and drain if the gate-source voltage is larger than the positive threshold voltage and therefore the switch is closed. If the gate-source voltage is lower than the positive threshold voltage or if it is zero or negative, the transistor is non-conducting and therefore the switch is open. Thus, the E-mode transistors can be characterized as "normally-off".

In the following, the D-mode transistor D in the circuit of FIG. 1 will be referred to as feedback transistor and the E-mode transistor E3 as input transistor. The source 1 of the input transistor E3 is connected to ground or the lower potential $V_{SS}$ of a supply voltage. The drain 2 of the input transistor E3 is provided for an output signal OUT. The gate 3 of the input transistor E3 is provided for an input signal IN, which may be a logical signal. The drain 2 of the input transistor E3 is connected via the connection 7 with the gate 6 of the feedback transistor D. The drain 5 of the feedback transistor D is connected to the higher potential $V_{DD}$ of the supply voltage. The drain 2 of the input transistor E3 is connected with the source 4 of the feedback transistor D via a component that generates a voltage drop, which is formed by two further E-mode transistors E1, E2 in this embodiment. The source 4 of the feedback transistor D is connected to the gate 10 of the first further transistor E1. The source 8 of the first further transistor E1 is connected to the gate 13 of the second further transistor E2. The source 11 of the second further transistor E2 is connected to the drain 2 of the input transistor E3. The drain 9 of the first further transistor E1 and the drain 12 of the second further transistor E2 can be left open, as shown in FIG. 1 by way of example. Instead, the drain 9 of the first further transistor E1 can be connected to the source 8 of the first further transistor E1, and/or the drain 12 of the second further transistor E2 can be connected to the source 11 of the second further transistor E2, so that the gate-source junction and the gate-drain junction of the transistors are switched parallel. The connections can be adapted to individual requirements, according to the characteristics of the transistors. In the example of FIG. 1, the gate-source junctions of the further transistors E1, E2 are connected in series between the source 4 of the feedback transistor D and the drain 2 of the input transistor E3. Although the component that generates a voltage drop can generally be provided by any suitable number of devices, the transistors of a GaAs BiFET process are typically dimensioned in such a fashion that two gate-source junctions connected in series may render an appropriate value of the voltage drop in question. The circuit secures a reliable low-current operation, irrespective of changing environmental or operating conditions. The operation of this circuit is as follows.

When a high voltage level is applied to the gate 3 of the input transistor E3, which means a high logical input signal IN, this voltage will drive the input transistor E3 into a conducting mode. The corresponding switch between source and drain is therefore closed, and the ground potential $V_{SS}$ is connected with the gate 6 of the feedback transistor D. The voltage of the input signal IN only needs to be high enough for the gate-source voltage of the input transistor E3 to be larger than the threshold voltage of this transistor. The voltage over the component that generates the voltage drop in the feedback loop, which is formed by the further transistors E1 and E2, makes a current flow through the circuit branch of the series of transistors D, E1, E2 and E3. The current through the further transistors E1 and E2 causes a voltage drop, so that the voltage level at the gate 6 of the feedback transistor D is lower than the voltage level at the source 4 of the feedback transistor D. The diodes of the gate-source junctions of the further transistors E1, E2 are dimensioned in such a manner that the voltage drop causes the feedback transistor D to be switched to a region around threshold (the gate-source voltage of the feedback transistor D being comparable to the threshold voltage). Consequently, the current flowing through the transistors D, E1, E2 and E3 is very low, while the voltage level at the drain 2 of the input transistor E3 is essentially on ground level ($V_{SS}$). Thus the high input signal IN is transformed into a low output signal OUT.

When a low voltage level is applied to the gate 3 of the input transistor E3, the gate-source voltage of the input transistor E3 is below its threshold voltage, so that the input transistor E3 is non-conducting, and almost no current flows through the source-drain path of the input transistor E3. The only current occurring in the circuit branch of the series of transistors D, E1 and E2 is a very small current through the output line provided for the output signal OUT. The further transistors E1 and E2 are dimensioned in such a manner that the voltage drop over their gate-source junctions be low enough for the negative gate-source voltage of the feedback transistor D to be above the more negative threshold voltage. Therefore the feedback transistor D is conducting between source and drain, and the corresponding switch is closed. Accordingly, the output signal OUT is on a high level. Thus the low input signal IN is transformed into a high output signal OUT, and this circuit therefore functions as an inverter.

Figure 2:
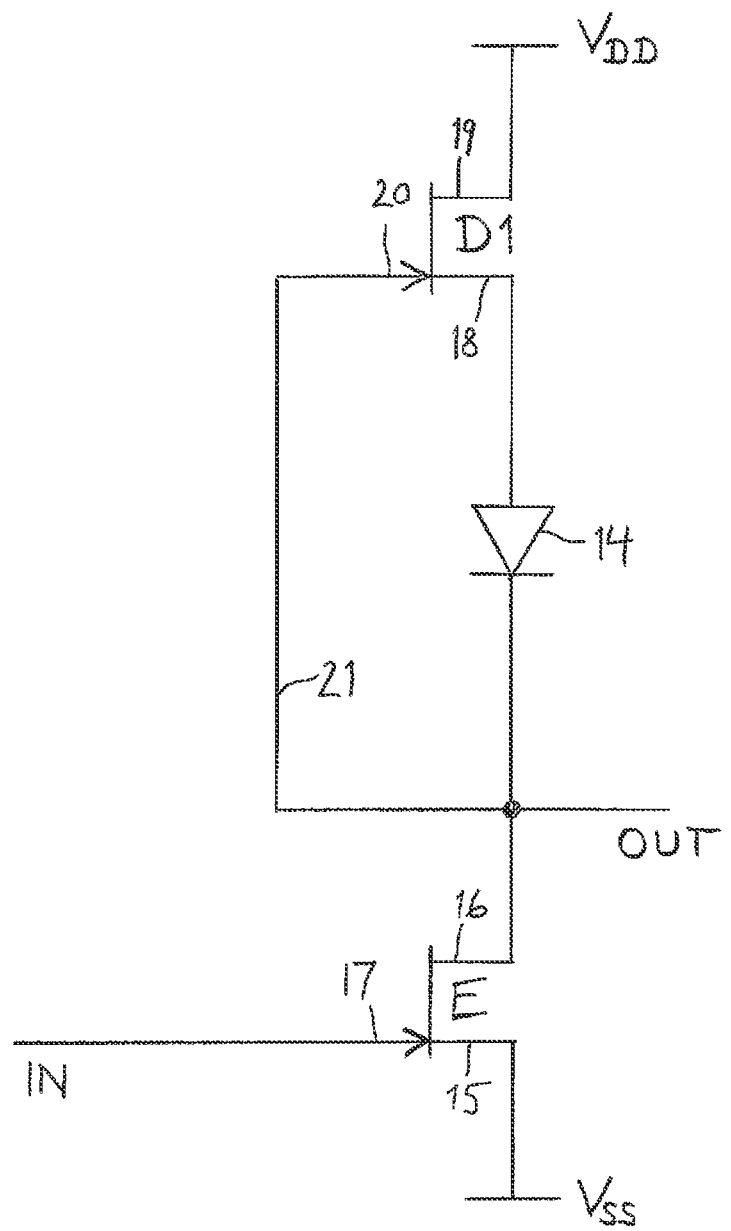
FIG. 2 shows a circuit diagram of a further embodiment.

FIG. 2 shows a further embodiment of the low-current circuit. In this embodiment, the component that generates a voltage drop, connected between the drain 16 of the input transistor E and the source 18 of the feedback transistor D1, is provided by a further diode 14, which may be a diode formed by the basis and the emitter or collector of a bipolar transistor or a heterobipolar transistor. The rest of the circuit is similar to the embodiment of FIG. 1. The bipolar or heterobipolar transistor can also be produced within a GaAs BiFET process.

The circuit according to FIG. 2 is especially suited to be applied as a buffer, connected to the output of a circuit according to FIG. 1. In this case, the drain 2 of the input transistor E3 of the circuit of FIG. 1 can be connected with the gate 17 of the input transistor E of the buffer circuit according to FIG. 2. It is not necessary to have a direct, immediate connection between these circuits; instead, further stages of the circuitry may be connected between a circuit according to FIG. 1 and a circuit according to FIG. 2. In order to simplify the explanation of the combined circuitry, a direct connection between the output of a circuit according to FIG. 1 and the input of a circuit according to FIG. 2 is assumed in the following description.

When an input signal IN of high voltage level is applied to the gate 3 of the input transistor E3, the input transistor E3 is conducting between source and drain, and the drain 2 of the input transistor E3 is essentially on ground level (VSS). Accordingly, the gate 17 of the input transistor E of the buffer circuit (FIG. 2) is on ground level, too. Consequently, the input transistor E of the buffer circuit is non-conducting between source 15 and drain 16, and the corresponding switch is open. In typical applications of this circuitry, there is a high-impedance load at the output of the buffer circuit provided for the output signal OUT (drain 16 of the input transistor E of the buffer circuit). Because of the high impedance, only a low current flows through the further diode 14. The voltage drop over the further diode 14 is therefore very low, and the gate-source voltage of the feedback transistor D1 of the buffer circuit is less negative than its threshold voltage. This means that the feedback transistor D1 is conducting between source 18 and drain 19, the corresponding switch is closed, and the voltage level at the drain 16 of the input transistor E of the buffer circuit is high. Thus, in a circuitry comprising a low-current circuit according to FIG. 1 with a buffer circuit according to FIG. 2, an output signal OUT of high voltage level corresponds to an input signal IN of high voltage level.

When an input signal IN of low voltage level is applied to the gate 3 of the input transistor E3, the drain 2 of the input transistor E3 is on a high voltage level. The current through the feedback transistor D and the further transistors E1, E2 is essentially the low gate current of the input transistor E of the buffer circuit. The input transistor E of the buffer circuit is conducting between source 15 and drain 16. Only a very low current flows through the further diode 14. The current through the feedback transistor D1 of the buffer circuit and the further diode 14 pulls the drain voltage of the input transistor E of the buffer circuit to a low voltage level. The voltage drop over the further diode 14 is sufficiently high, so that the gate-source voltage of the feedback transistor D1 of the buffer circuit allows only a very low current to flow through the feedback transistor D1. The output signal OUT is on a low level, so that in this case a low output signal OUT corresponds to a low input signal IN.

The input stage of the circuitry, formed by the low-current circuit of FIG. 1, may comprise a further diode similar to the one shown in the corresponding circuit loop of FIG. 2 instead of the further transistors E1 and E2. This further diode may also be a diode of a bipolar or heterobipolar transistor. The output stage of the circuitry, formed by the low-current buffer circuit of FIG. 2, may comprise one or more further gate-source and/or gate-drain junctions of transistors in the feedback loop instead of the further diode 14. But it may be advantageous to have the further diode 14 in the buffer circuit, because in this case the current may be better adapted to the requirements of the circuit components that are driven by the buffer. The further diode 14 of the buffer circuit enables the circuit to drive a load as hard as possible so that the voltage loss over the load is minimal. A high-impedance load may be a FET or a P-HEMT, for example.

The invention claimed is:

1. An inverter circuit, comprising:
   an input transistor and a feedback transistor, each comprising a source, a drain and a gate that is provided to control a channel between the source and the drain, and each having a gate-source junction,
   wherein the input transistor conducts between the source and the drain if a gate-source voltage that is applied between the gate and the source is more positive than a positive threshold voltage, and does not conduct between the source and the drain otherwise,
   wherein the feedback transistor does not conduct between the source and the drain if a gate-source voltage that is applied between the gate and the source is more negative than a negative threshold voltage, and conducts between the source and the drain otherwise,
   a component that generates a voltage drop between the source of the feedback transistor and the drain of the input transistor,
   a connection between the drain of the input transistor and the gate of the feedback transistor,
   wherein the source of the input transistor is to be connected to a first voltage level of a supply voltage,
   wherein the drain of the feedback transistor is to be connected to a second voltage level of the supply voltage,
   wherein the gate of the input transistor is provided for an input signal,
   wherein the drain of the input transistor is provided for an output signal,
   a buffer circuit forming an output stage, wherein the buffer circuit comprises an inverter circuit comprising:
   a second input transistor and a second feedback transistor, each comprising a source, a drain and a gate that is provided to control a channel between the source and the drain, and each having a second gate-source junction,
   wherein the second input transistor conducts between the source and the drain if a gate-source voltage that is applied between the gate and the source is more positive than a positive threshold voltage, and does not conduct between the source and the drain otherwise,
   wherein the second feedback transistor does not conduct between the source and the drain if a gate-source voltage that is applied between the gate and the source is more negative than a negative threshold voltage, and conducts between the source and the drain otherwise,
   a second component that generates a voltage drop between the source of the second feedback transistor and the drain of the second input transistor,
   a second connection between the drain of the second input transistor and the gate of the second feedback transistor,
   wherein the source of the second input transistor is to be connected to a first voltage level of the supply voltage,
   wherein the drain of the second feedback transistor is to be connected to a second voltage level of the supply voltage,
   wherein the gate of the second input transistor is provided for a second input signal, and
   wherein the drain of the second input transistor is provided for a second output signal.

2. The inverter circuit of claim 1, further comprising:
   a second further transistor comprising a source, a drain, a gate that is provided to control a channel between the source and the drain, and a gate-source junction, wherein the second component that generates the voltage drop comprises the gate-source junction of the second further transistor.

3. The inverter circuit of claim 1, further comprising:
   at least two second further transistors, each second further transistor comprising a source, a drain, a gate that is provided to control a channel between the source and the drain, and a gate-source junction,
   the second component that generates the voltage drop comprising the gate-source junctions of the second further transistors connected in series.

4. The inverter circuit of claim 1, wherein the second component that generates the voltage drop comprises a further diode.

5. The inverter circuit of claim 4, wherein the further diode is formed by a bipolar transistor.

6. The inverter circuit of claim 4, wherein the further diode is formed by a heterobipolar transistor.

7. A circuit comprising:
- an enhancement mode junction field effect transistor (JFET) with a gate-source junction;
- a depletion mode JFET with a gate-source junction;
- a component generating a voltage drop between a source of the depletion mode JFET and a drain of the enhancement mode JFET; and
- a connection between the drain of the enhancement mode JFET and a gate of the depletion mode JFET;
- wherein the component comprises first and second further enhancement mode transistors, a gate of the first further enhancement mode transistor being coupled to the source of the depletion mode JFET, a gate of the second further enhancement mode transistor being coupled to a source of the first further enhancement mode transistor, and a source of the second further enhancement mode transistor being coupled to the drain of the enhancement mode JFET.

8. The circuit of claim 7, wherein a gate of the enhancement mode JFET is coupled to an input signal node and wherein the drain of the enhancement mode JFET is coupled to an output signal node.

9. The circuit of claim 7, wherein the circuit is implemented in GaAs technology.

10. The circuit of claim 7, wherein the enhancement mode JFET, the depletion mode JFET, the first further enhancement mode transistor and the second further enhancement mode transistor each comprise a device of a BiFET technology in GaAs.

11. The circuit of claim 7, further comprising a buffer circuit, a drain of the enhancement mode JFET being connected an input of the buffer circuit.

12. The circuit of claim 11, wherein the drain of the enhancement mode JFET is coupled to a gate of an input transistor of the buffer circuit and wherein the drain of the enhancement mode JFET of the buffer circuit is coupled to an output signal node.

13. The circuit of claim 11, wherein the buffer circuit comprises:
- a second enhancement mode transistor with a gate-source junction;
- a second depletion mode transistor with a gate-source junction;
- a second component generating a voltage drop between a source of the second depletion mode transistor and a drain of the second enhancement mode transistor; and
- a second connection between the drain of the second enhancement mode transistor and a gate of the second depletion mode transistor.

14. The circuit of claim 13, wherein the second component comprises a diode.

15. The circuit of claim 7, wherein the first and second further enhancement mode transistors comprise gate-source junctions.

16. The circuit of claim 7, wherein the enhancement mode JFET conducts between the source and the drain when a gate-source voltage applied between the gate and the source is more positive than a positive threshold voltage and wherein the enhancement mode JFET does not conduct between the source and the drain when the gate-source voltage applied between the gate and the source is not more positive than the positive threshold voltage; and
- wherein the depletion mode JFET does not conduct between the source and the drain when a gate-source voltage applied between the gate and the source is more negative than a negative threshold voltage and wherein the depletion mode JFET conducts between the source and the drain when the gate-source voltage applied between the gate and the source is not more negative than a negative threshold voltage.

* * * * *